United States Patent [19]

Morimoto et al.

[11] Patent Number: 4,915,738

[45] Date of Patent: Apr. 10, 1990

[54] ALLOY TARGET FOR MANUFACTURING A MAGNETO-OPTICAL RECORDING MEDIUM

[75] Inventors: Toshio Morimoto; Tatsuo Nate, both of Ichikawa, Japan

[73] Assignee: Sumitomo Metal Mining Company Limited, Japan

[21] Appl. No.: 188,206

[22] Filed: Apr. 29, 1988

[30] Foreign Application Priority Data

Apr. 30, 1987 [JP] Japan ................... 62-104771

[51] Int. Cl.$^4$ ............................. C22C 29/00
[52] U.S. Cl. ..................... 75/246; 75/230; 75/243; 419/23; 419/45
[58] Field of Search ............ 75/246, 0.5 B, 0.5 AA, 75/243, 230; 419/45, 23; 428/332, 336, 928, 694; 148/307

[56] References Cited

U.S. PATENT DOCUMENTS 4,578,242  3/1986 Sharma ..................... 75/84
4,620,872 11/1986 Hijikata et al. ............ 75/246
4,767,455  9/1988 Jordan ..................... 75/84.4

Primary Examiner—Stephen J. Lechert, Jr.
Assistant Examiner—Nina Bhat
Attorney, Agent, or Firm—Watson, Cole, Grindle & Watson

[57] ABSTRACT

An alloy target for making a magneto-optical recording medium by sputtering comprises an alloy containing 10 to 50 atom % of at least one rare earth element selected from among Sm, Nd, Gd, Tb, Dy, Ho, Tm and Er, with a balance consisting substantially of at least one transition metal selected from among Co, Fe and Ni. The alloy has a mixed structure composed of at least one phase of an intermetallic compound formed by the rare earth element and the transition metal and a phase of the rare earth element along.

5 Claims, No Drawings

ALLOY TARGET FOR MANUFACTURING A MAGNETO-OPTICAL RECORDING MEDIUM

BACKGROUND OF THE INVENTION

1. Field of the Invention

This invention relates to an alloy target which is suitable for use in the manufacture of a magneto-optical recording medium by sputtering.

2. Description of the Prior Art

A magneto-optical memory has been drawing a great deal of attention as it facilitates the erasure and rerecording of information. Single-crystal materials such as garnets, polycrystalline materials such as MrBi and PtCo, or amorphous materials such as alloys of rare earth elements and transition metals are usually employed for manufacturing a magneto-optical memory.

The use of an amorphous alloy comprising a rare earth element or elements and a transition metal or metals, such as Tb-Fe-Co or Gd-Tb-Fe, provides a variety of advantages. For example, it enables the manufacture of a magneto-optical memory which requires only a small amount of energy for recording information, one which is free from any grain-boundary noise, or one which is large and yet is relatively easy to manufacture. A film of such an amorphous alloy is often formed by sputtering, i.e., by causing ions to collide with a target to form a film on a substrate positioned near it.

There are known a variety of materials which can be used for preparing a target. One of them is disclosed in Japanese Laid-Open Patent Specification No. 70550/1987. It has a mixed structure composed of a phase of an intermetallic compound of a rare earth element and a transition metal and a phase of a transition metal alone. This material has a number of advantages including (1) high cracking resistance and (2) uniform composition of a film.

However, it also has a number of drawbacks including the following:

(1) It can be sputtered only at a low speed;
(2) As the angular distribution of the intermetallic materials which is sputtered differs from that of the transition metal, it is only possible to form a film which is greatly different in composition from the target;
(3) Its permeability is so high that only a small magnetic flux leaks from the surface of the target, resulting in a low sputtering efficiency and thereby a low efficiency of use of the target, especially when a magnetron sputtering device is employed; and
(4) The surface of the target has a rapidly changing shape which causes the formation of a film changing in composition with the lapse of time.

SUMMARY OF THE INVENTION

It is, therefore, an object of this invention to provide an improved alloy target which can be sputtered at a high speed, enables the formation of a film which does not greatly differ in composition from the target, has a sufficiently low permeability to achieve a high efficiency of use, and enables the formation of a film not changing in composition with the lapse of time.

This object is attained by an alloy target which comprises an alloy containing 10 to 50 atom % of at least one rare earth elements selected from among Sm, Nd, Gd, Tb, Dy, Ho, Tm and Er, with a balance consisting essentially of at least one transition metal selected from among Co, Fe and Ni, the alloy having a mixed structure composed of at least one phase of an intermetallic compound formed by the rare earth element and the transition metal and a phase of the rare earth element.

The alloy target of this invention is uniform in composition of a film, has high toughness, can be sputtered at a high speed, has a low permeability which permits it to achieve a high efficiency of use, and enables the formation of a film of which the composition does not substantially differ from the target, or does not change with the lapse of time.

Other features and advantages of this invention will be apparent from the following detailed description.

DETAILED DESCRIPTION OF THE INVENTION

The alloy target of this invention contains 10 to 50 atom % of at least one rare earth element selected from among Sm, Nd, Gd, Tb, Dy, Ho, Tm and Er, with a balance consisting essentially of at least one transition metal selected from among Co, Fe and Ni. No material containing less than 10 atom %, or more than 50 atom %, of a rear earth element or elements would be able to form a film having good magneto-optical properties when sputtered. The target of this invention may contain unavoidable impurities, such as Ca, Si, C, P, S and Mn.

The alloy target of this invention has a mixed structure composed of at least one phase of an intermetallic compound and a phase consisting solely of a rare earth element. The latter phase does not only act as a binding phase for the former phase which is brittle, but also is effective for achieving a high sputtering speed and enabling the formation of a film which does not substantially differ in composition from the target. In this connection, it is preferable that the rare earth element phase have a size not exceeding 500 microns, contains at least 5% by volume thereof. It may be particulate, angular or columnar, or may take any other shape without limitation in particular. It is imperative that the target be essentially free from any phase consisting solely of a transition metal. The presence of any such phase would result in a lowering of efficiency with which the target can be used for sputtering, and in the formation of a film changing in composition with the lapse of time. There is no particular limitation to the number shape or size of the phase of the intermetallic compound.

The invention will now be described more specifically with reference to a few examples thereof, together with a process which can be used for manufacturing the alloy target of this invention.

EXAMPLE 1

A powder of $TB_4O_7$ having an average particle diameter not exceeding three microns, a powder of $Gd_2O_3$ having an average particle diameter not exceeding three microns, a powder of iron having a particle size not exceeding 200 mesh (as determined by a Tyler standard sieve; hereinafter referred to simply as "mesh"), a powder of cobalt having a particle size not exceeding 200 mesh, metallic calcium having a particle size not exceeding 4 mesh and anhydrous calcium chloride having a grain size not exceeding 100 mesh, each having a purity of at least 99.9% by weight, were mixed together carefully to produce three target samples of Tb-Fe, Tb-Fe-Co and Gd-Tb-Fe alloys, respectively, as shown in TABLE 1. The amount of each powder as employed for producing each sample is shown in TABLE 1.

TABLE 1

| Sample No. | Target alloy | Amounts of starting powders (g) | | | | | |
|---|---|---|---|---|---|---|---|
| | | $Tb_4O_7$ | $Gd_2O_3$ | Fe | Co | Ca | $CaCl_2$ |
| 1 | $Tb_{25}Fe_{75}$ | 312.0 | — | 307.2 | — | 156.0 | 30.0 |
| 2 | $Tb_{25}Fe_{65}Co_{10}$ | 311.4 | — | 265.2 | 43.2 | 155.4 | 30.0 |
| 3 | $Gd_{15}Tb_{10}Fe_{75}$ | 132.0 | 201.0 | 307.2 | — | 166.2 | 33.0 |

The mixture was placed in a reaction vessel of the stainless steel construction and was heated to a temperature of 1000° C. in about an hour in a stream of high-purity argon gas. It was held at that temperature for five hours and was thereafter cooled to an ordinary room temperature, whereby the mixture formed a lump. It was put in five liters of water and was thereby broken to yield a slurry. A supernatant suspension of $Ca(OH)_2$ was removed from the slurry by decantation. These steps of operation were repeated to yield an alloy powder. The alloy powder was contacted with dilute acetic acid having a pH of 4.5, washed in water and ethanol, and dried at a temperature of 50° C. in a vacuum having a pressure of $1 \times 10^{-2}$ Torr. The powder had an average particle diameter of 60 microns.

Five grams of a powder of metallic terbium (Tb) having a purity of at least 99.9% by weight and an average particle diameter of 20 mircons were mixed with 55 g of the above described alloy powder. The mixture was sintered under heat and pressure in a graphite mold having an inside diameter of 130 mm in a vacuum having a reduced pressure of $5 \times 10^{-5}$ Torr. A pressure of 150 kg/cm$^2$ was applied to the powder until it was heated to a temperature of 1000° C. and a pressure of 250 kg/cm$^2$ was thereafter applied thereto, while it was held at that temperature for an hour. Then, the sintered alloy product was cooled to an ordinary room temperature and removed from the mold.

A visual inspection of each sintered product did not reveal any crack thereon. No crack was found in the interior of any product, either, as a result of X-ray inspection. The composition, relative density and structure of each sample are shown in TABLE 2. The size and amount (% by volume) of the phase consisting solely of the rare earth element in each sample were determined by cutting. No phase consisting solely of a transition metal was found in any of the samples. The total amount of the rare earth element or elements in the surface of each sintered product was quantitatively analyzed by EPMA and the difference thereof was obtained. The results are shown in TABLE 3.

Each of the alloy targets which had been prepared as hereinabove described and had a diameter of 130 mm and a thickness of 4.5 mm was used to form a film having a thickness of 3000 Å by sputtering on a substrate of soda glass. The sputtering was carried out by employing argon gas having a pressure of $6 \times 10^{-5}$ Torr and an electric power of 4 W/cm$^2$. The sputtering operation could be continued with high stability. After sputtering, each target was inspected for cracks again as hereinabove described. No crack was found in any of the targets.

Each sample was examined with respect to the following items:
(1) Sputtering speed: The speed at which the film had been formed was calculated from its thickness and the time which had been required for forming it;
(2) Efficiency of use of the target: The weight loss of the target was measured when the target of which the thickness had been reduced as a result of a long time of use had a minimum thickness of 0.5 mm;
(3) Difference in composition between the target and the film: The total amounts of the rare earth elements in the target and the film were quantitatively analyzed by EPMA and their difference was obtained;
(4) Permeability of the target: The permeability of a sample which had been cut off the target was determined by a vibrating sample magneto meter; and
(5) Variation of film composition with time: Difference of the total amount of the rare earth element in the film obtained when sputtering had been continued for each of 5, 20, 40 and 60 hours was determined.

The results are shown in TABLE 3.

EXAMPLE 2

Alloy was prepared by melting 48.6 g of metallic terbium (Tb), 44.2 g of iron and 7.2 g of cobalt, all having a purity of at least 99.9% by weight, by arc discharge. Toluene was added to the alloy as a solvent and the mixture was crushed in a vibrating mill to form an alloy powder having an average particle diameter of 60 microns.

Five grams of a powder of metallic terbium having an average particle diameter of 20 microns and a purity of at least 99.9% by weight were mixed with 55 g of the above described alloy powder. Then, the processes of EXAMPLE 1 were repeated fo preparing a sintered alloy target and forming a film by sputtering.

No crack was found in the target by either visual or X-ray inspection. The composition, relative density and structure of the target are shown as Sample No. 4 in TABLE 2 above.

TABLE 2

| | Sample No. | Sintered target composition (wt %) | | | | | | Relative density (%) | Existing Intermetallic compound phase | Rare earth element | |
|---|---|---|---|---|---|---|---|---|---|---|---|
| | | Tb | Gd | Fe | Co | $O_2$ | Ca | | | Size (μm) | Vol. (%) |
| Example 1 | 1 | 48.6 | — | 51.2 | — | 0.15 | 0.02 | 99.8 | $Fe_2Tb$, $Fe_3Tb$ $Fe_{23}Tb_6$ | 60 | 6 |
| | 2 | 48.5 | — | 44.2 | 7.2 | 0.17 | 0.02 | 100 | $Fe_{77}Co_8Tb_{15}$ $Fe_{96}Co_2Tb_2$ | 50 | 7 |
| | 3 | 19.5 | 29.1 | 51.2 | — | 0.15 | 0.03 | 99.4 | $Fe_{66}Tb_{23}Gd_{11}$ $Fe_{97}Tb_2Gd$ | 60 | 10 |
| Example 2 | 4 | 48.2 | — | 44.0 | 7.2 | 0.5 | 0.01 | 99.0 | $Fe_{75}Co_8Tb_{17}$ $Fe_{35}Co_{25}Tb_{40}$ | 60 | 7 |
| Comparative Example | 5 | 48.6 | — | 43.8 | 7.1 | 0.4 | 0.01 | 99.5 | $Fe_8Co_{22}Tb_{70}$ $Fe_2Tb$, $Co_2Tb$ | — | — |

TABLE 3

| Sample No. | Example 1 | | | Example 2 | Comparative Example |
|---|---|---|---|---|---|
| | 1 | 2 | 3 | 4 | 5 |
| Difference of target composition (wt %) | 0.6 | 1.2 | 1.0 | 1.0 | 1.0 |
| Sputtering rate (shown as compared with the rate of Comparative Example taken as 1.0) | 1.20 | 1.20 | 1.20 | 1.15 | 1.0 |
| Efficiency of use of target (shown as compared with the efficiency of Comparative Example taken as 1.0) | 1.5 | 1.5 | 1.5 | 1.4 | 1.0 |
| Difference in composition between target and film (wt %) | 2.0 | 1.6 | 3.0 | 2.4 | 6.0 |
| Permeability of target (shown as compared with the permeability of Comparative Example taken as 1.0) | 0.65 | 0.65 | 0.70 | 0.80 | 1.0 |
| Change of film composition with time (wt %) | 0.55 | 0.60 | 0.60 | 0.65 | 1.5 |

The results of examination with respect to the various items as hereinabove set forth are shown in TABLE 3.

COMPARATIVE EXAMPLE 29.1 g of a powder of metallic terbium having an average particle diameter of 20 microns and 30.6 g of a powder of an Fe-Co alloy having an average particle diameter of 300 microns, each of which had been prepared by a melting and rapid cooling process and had a purity of at least 99.9% by weight, were mixed in a ball mill with methyl alcohol employed as a solvent and the resulting mixture was dried in a vacuum.

The mixed powder was sintered under heat and pressure in a graphite mold having an inside diameter of 130 mm. It was sintered in a vacuum having a reduced pressure of $5 \times 10^{-5}$ Torr. A pressure of 300 kg/cm$^2$ was applied to the powder until it was heated to a temperature of 700° C., and the powder was held at that temperature for an hour. Then, the pressure was lowered to 10 kg/cm$^2$ and the compacted powder was heated again to a temperature of 900° C. After it had been held at that temperature for 20 minutes, it was cooled to an ordinary room temperature under no load and was thereafter removed from the mold to yield a sintered alloy target. No crack was found therein. Its composition, relative density and structure are shown as Sample No. 5 in TABLE 2. It did not contain any phase composed solely of a rare earth element, but contained 7% by volume of a phase composed solely of a transition metal and having a size of about 60 microns.

The target was used for forming a film by repeating the process which had been employed in EXAMPLE 1. The results of examination with respect to the various items as hereinbefore set forth are shown in TABLE 3 (Sample No. 5).

What is claimed is:

1. An alloy target for making a magneto-optical recording medium by sputtering comprising an alloy containing 10 to 50 atom % of at least one rare earth element selected from the group consisting of Sm, Nd, Gd, Tb, Dy, Ho, Tm and Er, the balance being substantially at least one transition metal selected from the group consisting of Co, Fe and Ni, said alloy having a mixed structure composed of at least one phase of an intermetallic compound formed by said rare earth element and said transition metal and a phase of said rare earth element alone, and containing no phase exclusively composed of a transition metal.

2. An alloy target as set forth in claim 1, wherein said alloy further contains at least one element selected from the group consisting of Ca, Si, C, P, S and Mn.

3. An alloy target as set forth in claim 1, wherein said alloy contains at least 5% by volume of said phase of said rare earth element alone.

4. An alloy target as set forth in claim 1, wherein said phase of said rare earth element alone has a size up to and including 500 microns.

5. An alloy target as set forth in claim 1, wherein said phase of said rare earth element alone is particulate, angular or columnar in shape.

* * * * *